(12) United States Patent
Schillaci et al.

(10) Patent No.: US 6,365,930 B1
(45) Date of Patent: Apr. 2, 2002

(54) EDGE TERMINATION OF SEMICONDUCTOR DEVICES FOR HIGH VOLTAGES WITH RESISTIVE VOLTAGE DIVIDER

(75) Inventors: Antonino Schillaci, Messina; Antonio Grimaldi, Mascalucia; Giuseppe Ferla, Catania, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/585,008

(22) Filed: Jun. 1, 2000

(30) Foreign Application Priority Data

Jun. 3, 1999 (EP) .............................................. 99830339

(51) Int. Cl.[7] .............................................. H01L 29/76
(52) U.S. Cl. .............................. 257/339; 357/71; 357/53
(58) Field of Search ................................ 257/339, 760, 257/685, 773, 386, 341, 346; 357/71, 52, 53, 23; 438/270, 271, 282

(56) References Cited

U.S. PATENT DOCUMENTS

| 4,229,756 A | * | 10/1980 | Sato ............................. 357/42 |
| 4,391,650 A | * | 7/1983 | Pfeifer ......................... 29/571 |
| 4,467,312 A | * | 8/1984 | Komatsu .................... 338/309 |
| 4,468,686 A | | 8/1984 | Rosenthal ..................... 357/53 |
| 4,633,292 A | | 12/1986 | Fillinger et al. .............. 357/53 |
| 5,474,946 A | | 12/1995 | Ajit et al. ..................... 437/41 |
| 5,798,549 A | * | 8/1998 | Blanchard .................... 257/335 |
| 5,877,667 A | * | 3/1999 | Wollesen ..................... 336/200 |
| 6,051,862 A | * | 4/2000 | Grimaldi ..................... 257/341 |
| 6,064,087 A | * | 5/2000 | Margi' ......................... 257/341 |
| 6,064,089 A | * | 5/2000 | Jinbo .......................... 257/346 |
| 6,163,173 A | * | 12/2000 | Storino ........................ 326/98 |
| 6,204,097 B1 | * | 3/2001 | Shen .......................... 438/133 |
| 6,229,342 B1 | * | 5/2001 | Noble ......................... 326/102 |
| 6,242,784 B1 | * | 6/2001 | Zeng .......................... 257/409 |

FOREIGN PATENT DOCUMENTS

| JP | 405021804 A | * | 1/1993 |
| JP | 406177376 A | * | 6/1994 |

OTHER PUBLICATIONS

European Search Report from European Patent Application 99830339.0, filed Jun. 3, 1999.
Patent Abstracts of Japan, vol. 007, No. 094 (E–171), Apr. 20, 1983 & JP–A–58 017676 (Tokyo Shibaura Denki KK).

* cited by examiner

*Primary Examiner*—Olik Chaudhuri
*Assistant Examiner*—Nathan W. Ha
(74) *Attorney, Agent, or Firm*—Wolf, Greenfield & Sacks, P.C.; James H. Morris

(57) ABSTRACT

Semiconductor device for high voltages including at least one power component and at least one edge termination. The edge termination includes a voltage divider including a plurality of MOS transistors in series, and the edge termination is connected between non-driveble terminals of said power component.

7 Claims, 7 Drawing Sheets

EDGE TERMINATION OF SEMICONDUCTOR DEVICES FOR HIGH VOLTAGES WITH RESISTIVE VOLTAGE DIVIDER

BACKGROUND OF THE INVENTION

1. Field of the Invention

The present invention relates to an improvement of semiconductor devices for high voltages, particularly of power devices in MOS technology. More particularly the invention relates to an improvement of edge termination of said devices with a resistive voltage divider.

2. Discussion of the Related Art

The main problem of the raggedness of power devices in MOS technology at high voltages lies essentially in the breakdown voltage of the MOS devices. The phenomenon of the MOS devices' breakdown lies essentially in the less resistive region, which is in the edge of the junction between the body pocket and the underlying drain layer. In fact the equipotential lines of the electric field thicken in the aforesaid zone causing the breakdown of the device at a lower voltage than the theoretical breakdown voltage.

A typical technology to improve such behavior of power devices in MOS technology consists in the deposition of a metal layer, in a step like structure (the metal is first deposited over a thin oxide, then over a thicker oxide), in correspondence to the device's periphery, in order to avoid the thickening of the electric field's lines at the edge of the junction between the body pocket and the underlying drain layer.

The more recent prior art presents a particular manufacturing of the power device in MOS technology, wherein besides the double step metallization over a thin oxide layer and a double layer formed by oxide and polysilicon, a guard-ring is added. Such a ring is constituted by a P+ pocket where before a thick field oxide layer is placed and then a silox layer is placed, where the silox is a insulating material, usually silicon dioxide doped by phosphorus. The aim of this multi-layer of silicon oxide, polysilicon, silox and aluminium is to make a bridge structure which widens the electric field lines of the device's body. The polysilicon is connected or capacitively coupled with the aluminium layer. The silox layer serves to prevent the polarization of the layers under influence of lateral high fields through the device's surface. The use of the P+ pocket serves to planarize the electric field's lines; in fact the P+ pocket has a conductivity opposite to the N− epitaxial layer wherein it is formed in order to allow an extension of the electric field lines in parallel to the device's surface.

The use of the field-plates with a guard-ring presents a limit for the high operating voltage the device is submitted to.

In view of the state of the art described, it is an object of the present invention to provide a technology for manufacturing a semiconductor device with an edge termination which allows the semiconductor device to resist to the high operating voltages it is submitted to.

SUMMARY OF THE INVENTION

According to the present invention, these and other objects are attained by a semiconductor device for high voltages comprising at least one power component and at least one edge termination, wherein said edge termination comprises a voltage divider including a plurality of MOS transistors in series, and said edge termination being connected between non-driveble terminals of said power component.

Thanks to the present invention it is possible to form a semiconductor device for high voltages allowing to obtain, thanks to existence of a voltage divider, a higher breakdown voltage.

BRIEF DESCRIPTION OF THE DRAWINGS

The features and the advantages of the present invention will be made evident by the following detailed description of a particular embodiment, illustrated as not limiting example in the annexed drawings, wherein:

FIG. 4 shows a cross-section along lines IV—IV of FIG. 2a;

DETAILED DESCRIPTION

Figure 1:
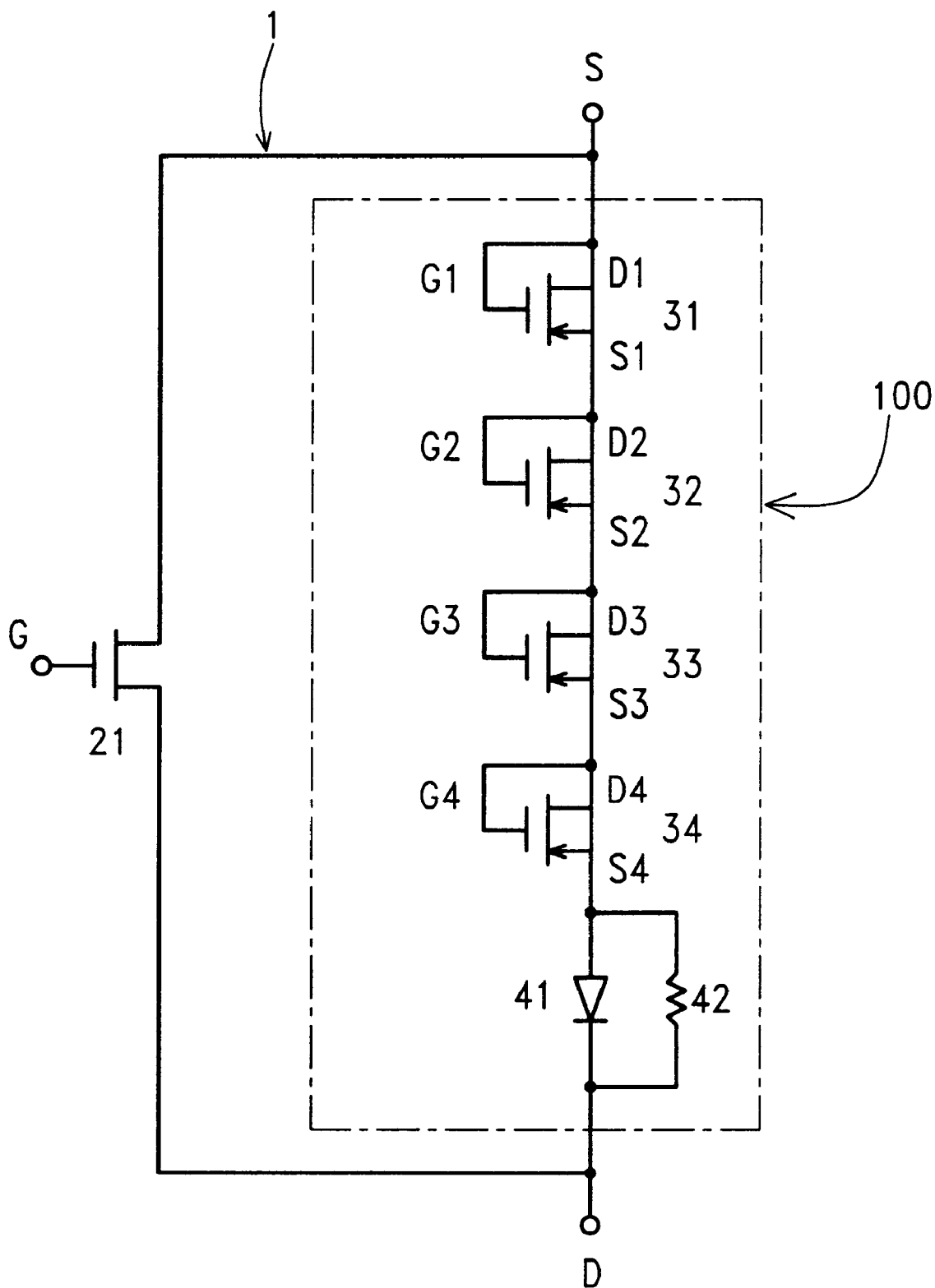
FIG. 1 is a circuit schematic view of a device according to an embodiment of the present invention.

With reference to the annexed drawings, and specifically to FIG. 1, a circuit schematic view of a device 1 is shown. This device 1 is constituted by a power MOSFET 21 connected to an edge termination 100, according to a embodiment of the present invention. The MOSFET power transistor 21 is connected to PMOS parasitic transistors 31, 32, 33, 34, in series, each of them in diode connection. In fact the source terminal S of the power transistor 21 is connected to the drain terminal D1 of the first parasitic transistor 31, which has the source terminal Si connected to the drain terminal D2 of a second PMOS parasitic transistor and so continuing to arrive to a fourth PMOS parasitic transistor 34 having the source terminal S4 connected to anode of a diode 41 and to one extremity of a resistance 42. The cathode of the diode 41 and the other extremity of the resistance 42 are connected to drain terminal D of the MOSFET power transistor 21. The PMOS parasitic transistors form the edge termination of the power device 21. The PMOS parasitic transistor are switched on when the respective source overcomes the threshold voltage of the PMOS, in order to allow a current flow from the source terminal S4 of the fourth PMOS parasitic transistor to source terminal S of the MOSFET power transistor 21. Such current, allowing a partition of the drain-source potential of the MOSFET power transistor 21, allows also a distribution of the electric field lines in parallel at the surface of the device 1.

Figure 2:
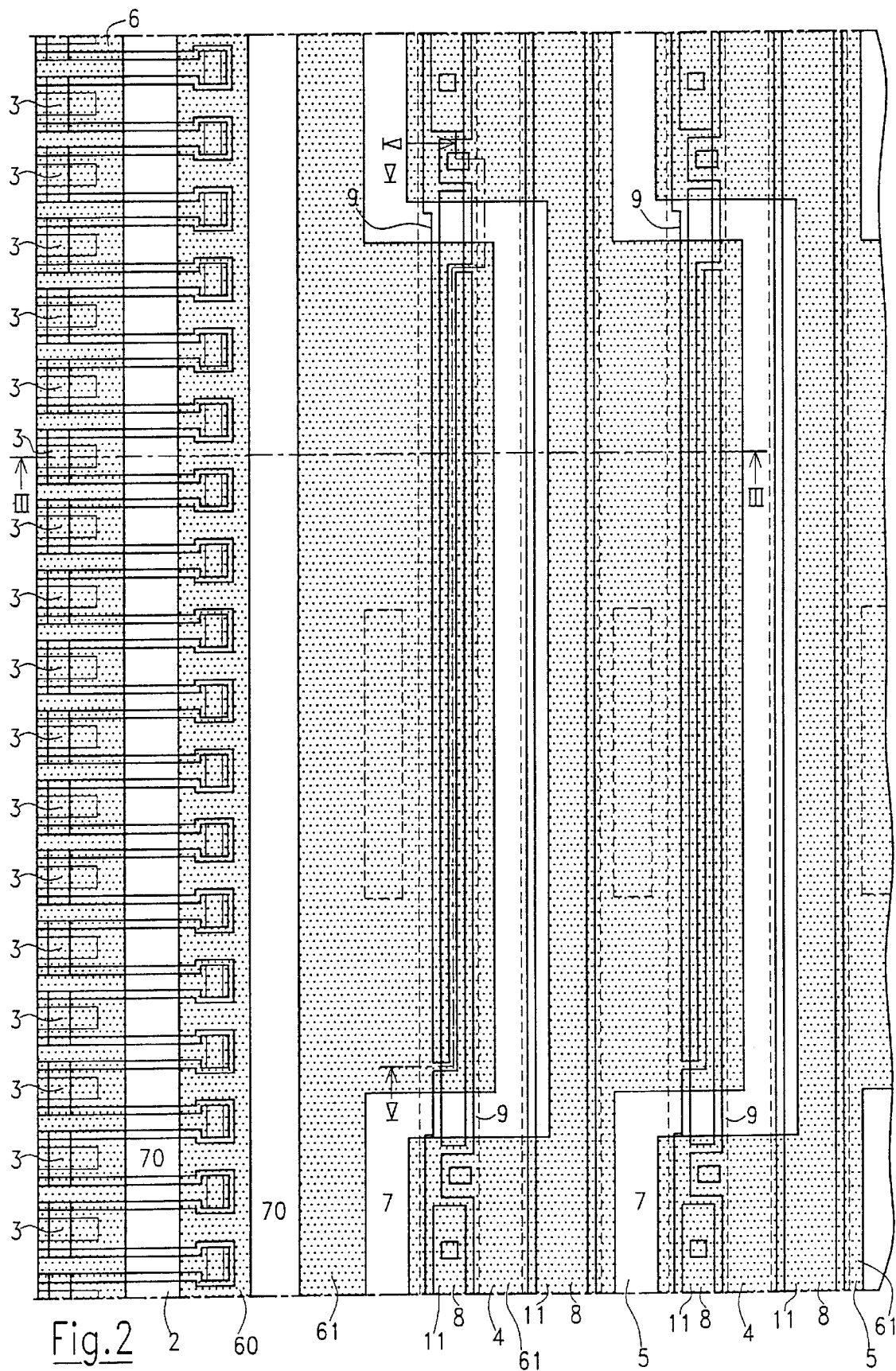
FIG. 2 is the layout of a first part of the edge termination of the device according an embodiment of the present invention.
Figure 2A:
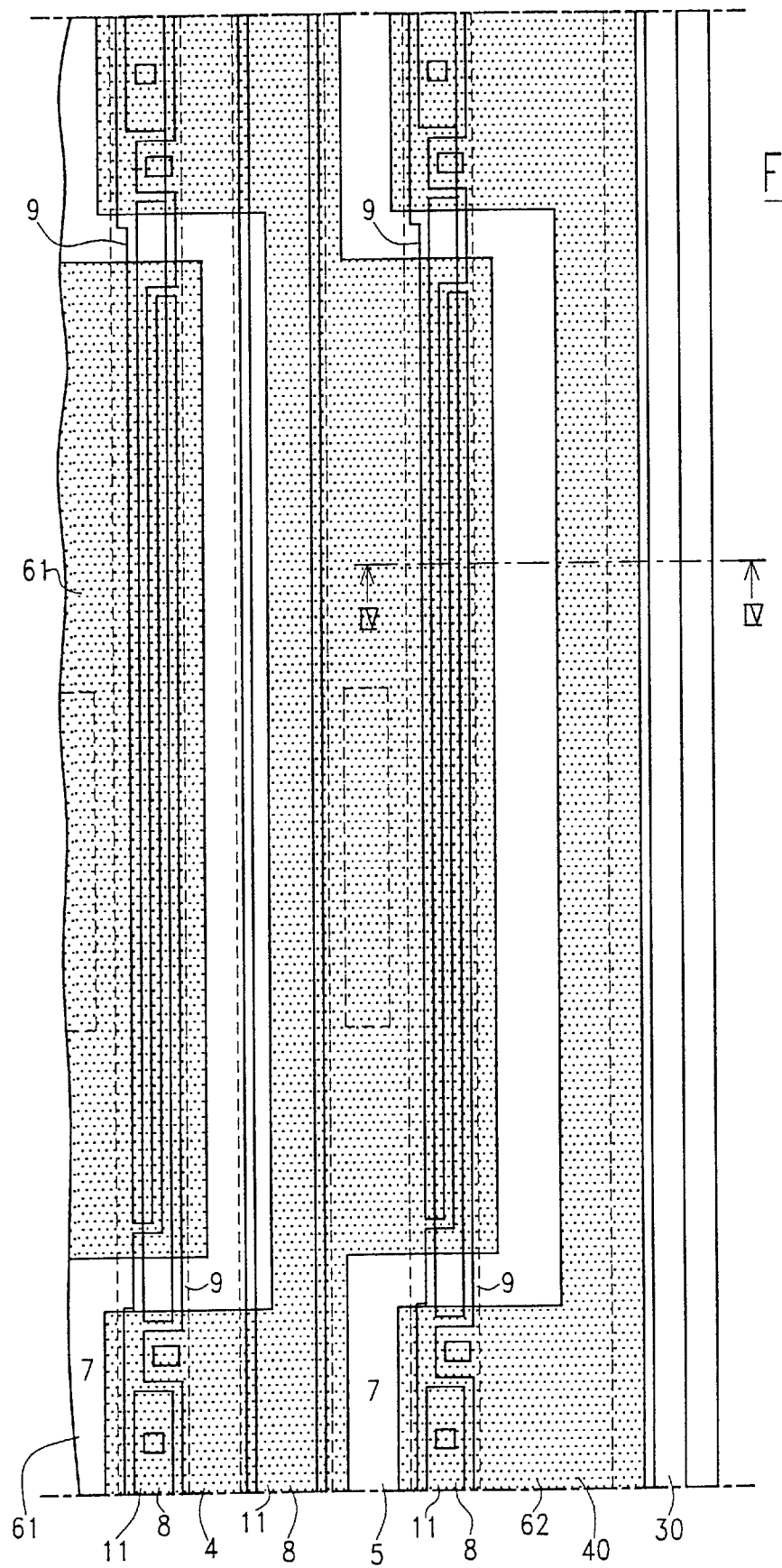
FIG. 2a is the layout of a second part of the edge termination of the device according an embodiment of the present invention.
Figure 3:
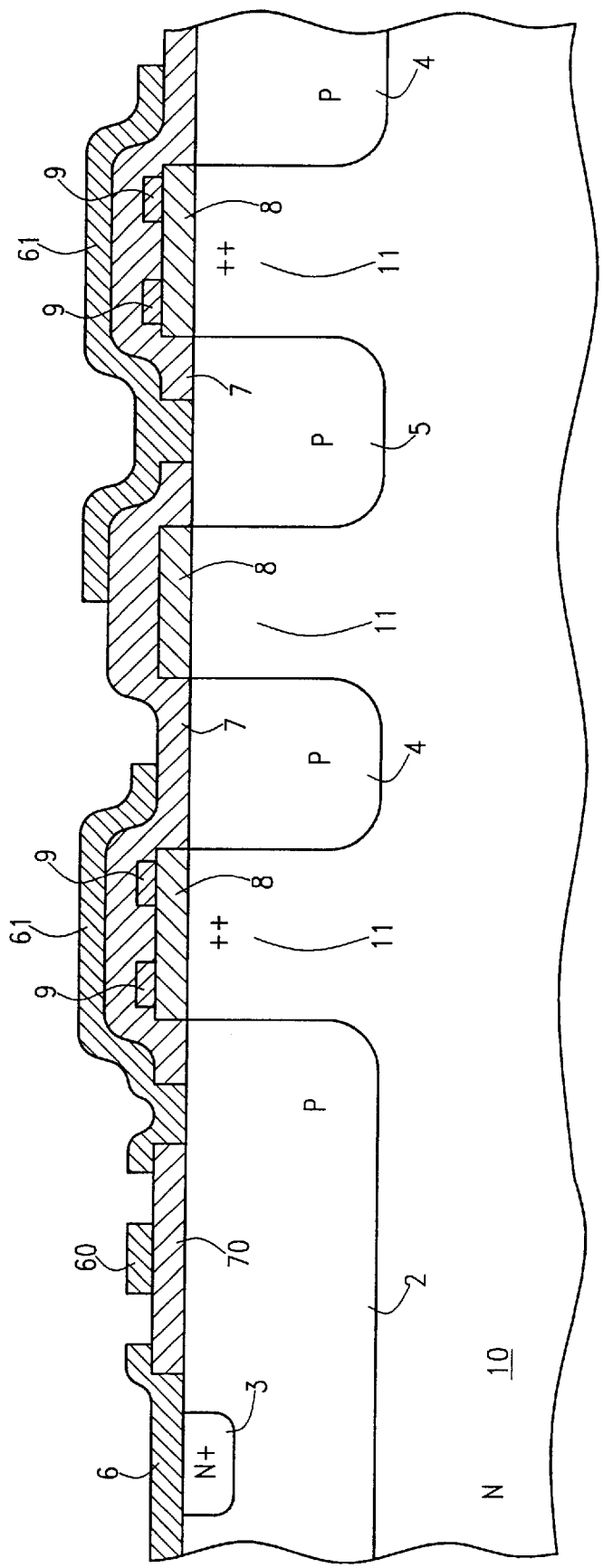
FIG. 3 shows a cross-section along lines III—III of FIG. 2.
Figure 4:
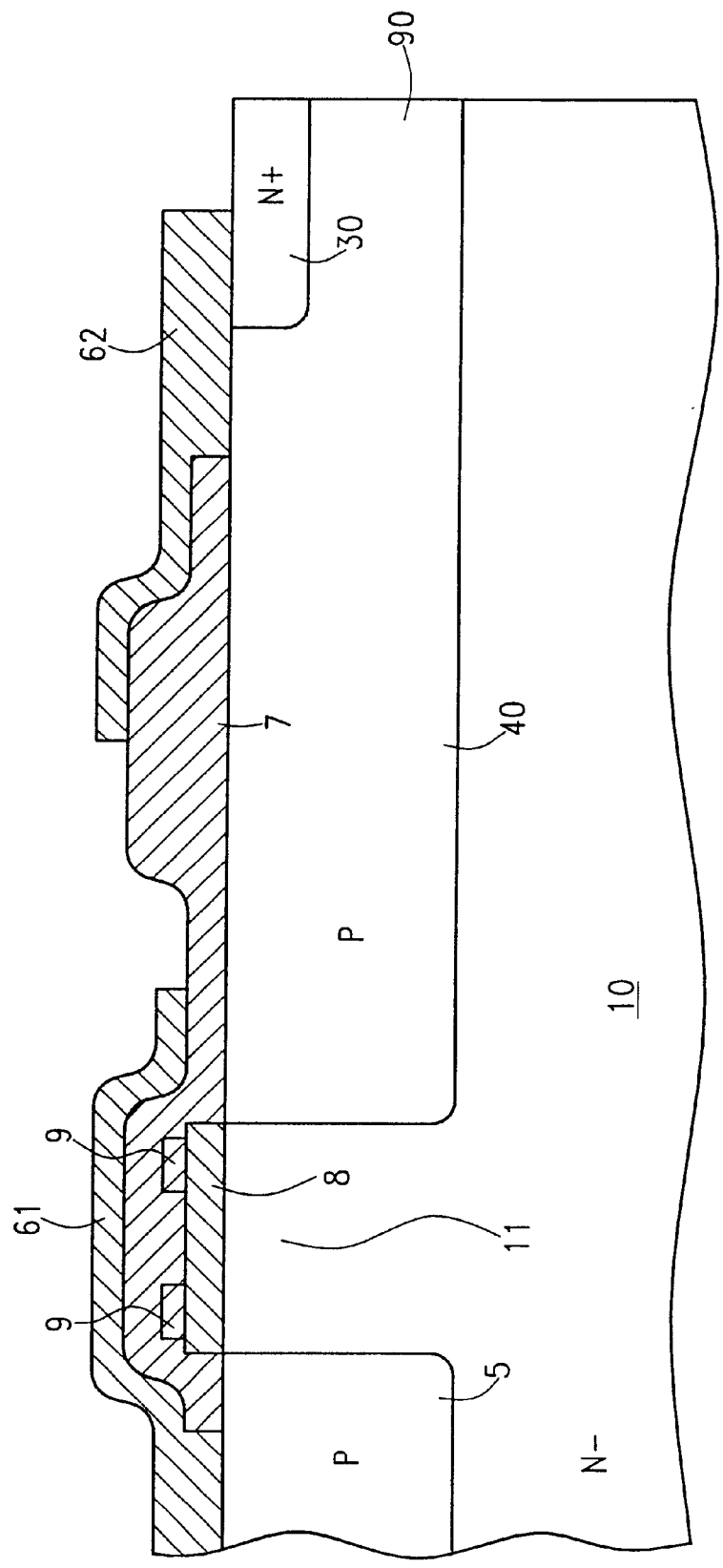
Figure 5:
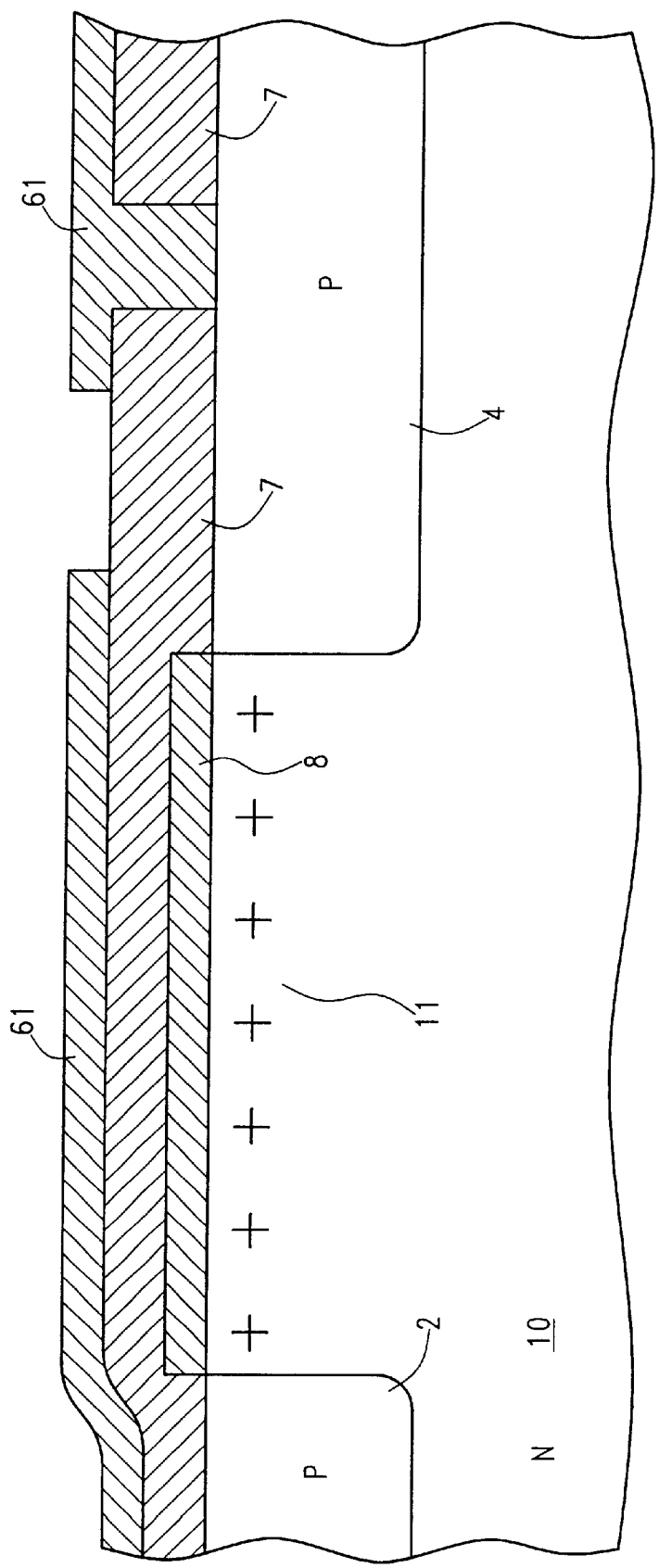
FIG. 5 shows a cross-section along lines V—V of FIG. 2.

In FIG. 2 the layout of a first part of the edge termination of the device 1 according to invention is shown. With reference to FIG. 2 and FIG. 3, which shows a crosssectional view of the edge termination 100 along a line III—III, in a N semiconductor layer 10 which acts as drain of the MOSFET power transistor 21 and wherein the elementary units of the MOSFET power transistor 21 are formed, P silicon stripes 2, 4, 5, alternated by portions 11 of the same layer 10 of which at the free surface a silicon oxide layer 8 is present, are formed. At the peripheral zone of the layer 10 the P silicon stripe 2 merged together with the body region of the MOSFET power transistor 21 is present. Such stripe 2 contains a silicon region 3 with high concentration of N type dopant, which represents the source region of the transistor 21. At the free surface of the stripe 2, in periphery, a metal layer 6 is placed, which allows to contact both the body and the source of the power transistor 21. In a superficial succession of layers superimposed on the silicon stripe 2, the metal layer 6 is followed by a first dielectric layer 7 which is followed by a first metal layer 61 and a second dielectric layer 7. In the middle of the free surface of the first dielectric layer 7 a metal layer 60 is placed that represents a gate metal ring. At the free surface of the oxide layer 8 following the stripe 2, two narrow polysilicon layers 9 are placed, which are alternated with and underlie the second dielectric layer 7, which has a thickness equal to thickness of the oxide layer 8 and extending over the P silicon stripe 4, over the second silicon oxide layer 8 and partially over the P silicon stripe 5. At the free surface of the second dielectric layer 7 the first metal layer 61 is placed that extend substantially to a zone in correspondence of the half of the silicon stripe 4. Inside the silicon portions 11, in a zone in correspondence of the second dielectric layer 7 delimited by two polysilicon layers 5, the channel of the PMOS parasitic transistor is formed. The silicon stripe 4, which does not need to be present, is electrically contacted with the silicon stripe 5, which acts as source of the transistor 31 while the drain of such transistor is constituted by the silicon stripe 2, as shown in more detail in FIG. 5. The gate contact of the PMOS parasitic transistor 31 is constituted by the first metal layer 61 which contacts also the stripe 2 which is the drain of the parasitic transistor 31. The stripe 2 allows the diode connection of the parasitic transistor 31. In fact the operating voltage of the device 1 is so high that it allows the channel's formation, if the thickness of the gate, which is formed by two overlapped silicon oxide 8 and dielectrics 7 layers, is large. The second metal layer 61 allows to contact the stripe 4 with the P silicon stripe 5 which represents the drain of a second PMOS parasitic transistor 32. The formation of the PMOS parasitic transistor 32 and of the other PMOS parasitic transistors 33, 34 is similar to the formation of the PMOS parasitic transistor 31, previously described. The end of the layout of FIG. 2a, shown in more detail in FIG. 4, comprises a P silicon stripe 40, which is located inside the layer 10 and represents the source of the parasitic transistor 34. Such stripe 40 contains a silicon stripe 30 with high concentration of N type dopant. This silicon stripe 30 forms the drain contact of the power transistor 21. However, this contact is made by defects inside the "scribe-line" and these defects form a resistance 42. Also a diode 41, which is formed by the junction between the silicon stripe 40 and the layer 10, is present between the source terminal of the PMOS parasitic transistor 34 and the drain terminal of the power transistor 21. A third dielectric layer 7, forming with the third silicon oxide layer 8 the gate of the parasitic transistor 34, extends over a free surface of the stripe 40, with a different thickness and to about the half of the stripe 40. A metal layer 62 is superimposed on the third dielectric layer 7, in correspondence of the middle of the stripe 40 and it is placed at the part of the free surface of the stripes 30 and 40, in order to allow contact with the source of the transistor 34.

The P stripes 5 allow to planarize the electric field's lines when the device 1 is exposed to a high reverse-bias polarization voltage between drain and source of the power transistor 21. So the thickening of the electric field's lines in the body 2 of the power transistor is avoided, in order to allow an increase of the breakdown voltage of the device 1. Also the edge termination constituted by the PMOS parasitic transistor allows a voltage partition at the device's surface.

The presence of the thick oxide and dielectric layers allow the electric field lines to avoid thickening in the body region of the power transistor 21, when the PMOS parasitic transistors are not switched on. The channel that is formed in parallel to the P silicon stripes, is so long that the single PMOS parasitic transistors can withstand a higher voltage.

Figure 6:
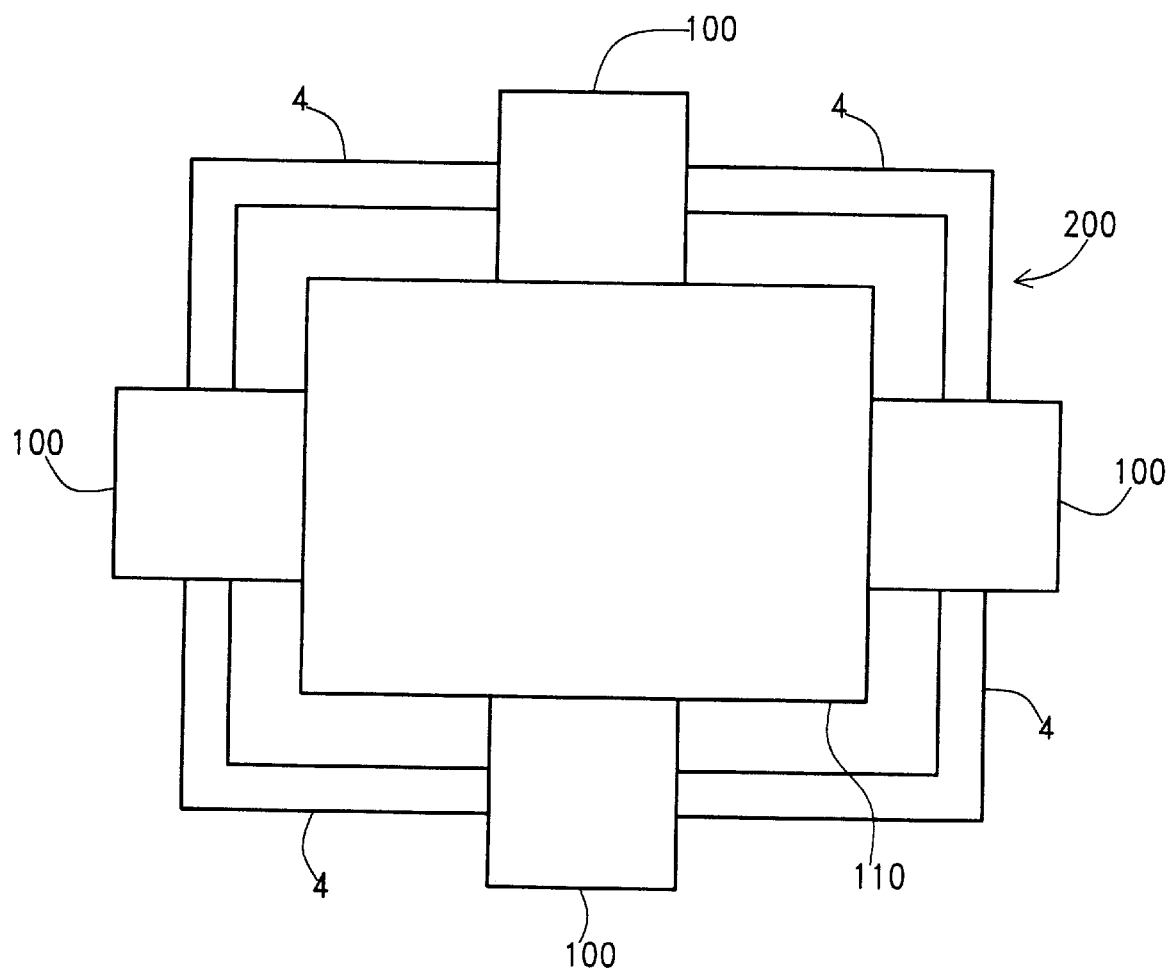
FIG. 6 is a schematic top-plan view of the chip according to an embodiment of the present invention.

FIG. 6 shows a schematic view of the chip 200 of the device comprising a MOSFET power transistor in the region 110 with the edge terminations placed in the middle of four sides of the zone 110, and silicon stripes 5 that, together combined, form silicon rings extending along the periphery of the chip 200.

The manufacturing of such edge terminations 100 does not require supplementary steps.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Semiconductor device for high voltages comprising at least one power component and at least one edge termination wherein said edge termination comprises a voltage divider including a plurality of MOS transistors in series, and said edge termination being connected between non-drivable terminals of said power component.

2. Semiconductor device for high voltage according to claim 1, wherein said MOS transistors have active regions formed by silicon stripes of a first conductivity type, said silicon stripes being located inside a silicon layer of a second conductivity type and alternated to portions of said silicon layer, each of said MOS transistors having a gate over said portions of said silicon layer, said gate being formed by one metal layer superimposed on a multi-layer formed by dielectric layers superimposed on a silicon oxide layers, and the channel of each said MOS transistors is parallel to said silicon stripes and is delimited by two polysilicon stripes, said two polysilicon stripes being superimposed on said silicon oxide layers and alternated and underlying said dielectric layers.

3. Semiconductor device for high voltage according to claim 2, wherein said MOS transistors are in diode connection.

4. Semiconductor device for high voltage according to claim 3, wherein said MOS transistors are PMOS transistors and said silicon stripes are P silicon stripes, the source and drain regions of said PMOS transistors being constituted by couples of said stripes contacted by said metal layers.

5. Semiconductor device for high voltage according to claim 1, wherein the body region of said power component and the silicon stripe which is the drain region of a first of said PMOS transistors, are merged together.

6. Semiconductor device for high voltages according to claim 5, wherein said edge terminations are placed in a chip in four sides of a zone wherein said power transistor is located, because each of said edge terminations is located substantially in the middle of each of the four sides.

7. Semiconductor device for high voltages according to claim 6, wherein concentric P silicon rings are provided, which are placed at the periphery of said chip and intersect said edge terminations in order to be intercalated with said P silicon stripes, in order to be adjacent to channels of said PMOS transistors and being connected to P silicon stripes which acts as sources of said PMOS transistors by said metal layers.

* * * * *

UNITED STATES PATENT AND TRADEMARK OFFICE
CERTIFICATE OF CORRECTION

PATENT NO. : 6,365,930 B1
DATED : April 2, 2002
INVENTOR(S) : Schillaci et al.

It is certified that error appears in the above-identified patent and that said Letters Patent is hereby corrected as shown below:

Title page,
Item [*] Notice, delete the phrase "by 0 days" and insert -- by 24 days --

Signed and Sealed this

Twelfth Day of October, 2004

JON W. DUDAS
*Director of the United States Patent and Trademark Office*